(12) United States Patent
Matsushita

(10) Patent No.: US 6,335,648 B1
(45) Date of Patent: Jan. 1, 2002

(54) CIRCUIT USING INTERNAL PULL-UP/PULL-DOWN RESISTOR DURING RESET

(75) Inventor: Hiroshi Matsushita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/644,045

(22) Filed: Aug. 23, 2000

(30) Foreign Application Priority Data

Aug. 24, 1999 (JP) .......................................... 11-236548

(51) Int. Cl.[7] ..................... H03K 17/20; H03K 19/173

(52) U.S. Cl. ..................... 327/198; 327/321; 327/594; 326/57; 326/82

(58) Field of Search ................................ 327/142, 185, 327/198, 333, 594, 321; 326/56, 57, 82, 86, 90

(56) References Cited

U.S. PATENT DOCUMENTS

| 5,500,611 | A | * | 3/1996 | Popat et al. | 326/87 |
| 5,764,075 | A | * | 6/1998 | Fukushima | 326/57 |
| 5,963,047 | A | * | 10/1999 | Kwong et al. | 326/83 |
| 6,130,550 | A | * | 10/2000 | Zaliznyak et al. | 326/38 |
| 6,232,678 | B1 | * | 5/2001 | Murata | 307/130 |

* cited by examiner

Primary Examiner—Timothy P. Callahan
Assistant Examiner—Terry L. Englund
(74) Attorney, Agent, or Firm—Sughrue Mion, PLLC

(57) ABSTRACT

When a semiconductor integrated circuit device is reset, an input and output node is to be pulled down or up for stability of the integrated circuit, wherein a series combination of a pull-down resistor/pull-up resistor and a switching transistor is integrated on the semiconductor chip in such a manner as to permit the switching transistor to flow electric current through the pull-down/pull-up resistor only when the semiconductor integrated circuit device is reset, thereby enhancing the stability without sacrifice of the power consumption.

19 Claims, 2 Drawing Sheets

CIRCUIT USING INTERNAL PULL-UP/PULL-DOWN RESISTOR DURING RESET

FIELD OF THE INVENTION

This invention relates to a semiconductor device and, more particularly, to a semiconductor integrated circuit device with an input and output circuit.

DESCRIPTION OF THE RELATED ART

Input signals are supplied from the outside of an integrated circuit device through the input and output circuit for pieces of information, and the integrated circuit device processes the pieces of information for producing output signals. The output signals are supplied through the input and output circuit to the outside thereof. Thus, the input and output circuit serves as an interface, and is indispensable for the integrated circuit.

A typical example of the input and output circuit is shown in FIG. 1 of the drawings. The prior art input and output circuit is incorporated in an integrated circuit 1 fabricated on a semiconductor chip, and the prior art input and output circuit includes an output buffer BF1 and an input buffer BF2. An input and output node NODE1 is shared between the output buffer BF1 and the input buffer BF2, and is connected to the output node of the output buffer BF1 and the input node of the input buffer BF2. The input node of the output buffer BF1 is connected to an internal node NODE2 of the integrated circuit, and the output node of the input buffer BF2 is connected to another internal node NODE3 of the integrated circuit.

In order to selectively activate the output/input buffers BF1/BF2, enable signals ENB1 and ENB2 are respectively supplied to the control node of the output buffer BF1 and the control node of the input buffer BF2. When the output buffer BF1 is enabled with the enable signal ENB1, the output buffer BF1 drives the input and output node NODE1 depending upon the potential level at the internal node NODE2. On the other hand, if the enable signal ENB2 is changed to the active level, the input buffer BF2 is enabled, and drives the internal node NODE3 depending upon the potential level at the input and output node NODE1. While the input buffer BF2 is driving the internal node NODE3 in response to the potential level at the input and output node NODE1, the output buffer BF1 is staying in high-impedance state, and the input and output node NODE1 is seemed to be in the high-impedance state from the point of view at the internal node NODE2.

The semiconductor integrated circuit device forms a part of an electronic system, and is mounted on a circuit board together with other semiconductor chips. A pull-down resistor 2 is also mounted on the circuit board, and is connected between the input and output node NODE1 and the ground. When the system is reset, electric charge is discharged from the input and output node NODE1 to the ground, and the input and output node NODE1 is pulled down to the ground level. The pull-down resistor 2 is desirable for the stability of the integrated circuit device. The pull-down resistor 2 may be replaced with a pull-up resistor connected between the input and output node NODE1 and a power supply line.

A problem is encountered in the prior art semiconductor integrated circuit device in that a system composer needs to connect the pull-down resistor 2 in the assembling work for the electronic system. The system composer purchases a discrete circuit component for the pull-down resistor 2, and time and labor are consumed in the assembling work. This results in increase of the production cost of the electronic system.

SUMMARY OF THE INVENTION

It is therefore an important object of the present invention to provide a semiconductor integrated circuit device, which permits a system composer to reduce the production cost of an electric system.

The present inventor contemplated the problem inherent in the prior art semiconductor integrated circuit device, and tried to integrate a pull-up/pull-down resistor on a semiconductor chip together with the integrated circuit device. The semiconductor integrated circuit device with the pull-up/pull-down resistor flew electric current at all times, and a large internal power supply circuit was required. The present inventor noticed that the input and output circuit required the pull-up/pull-down resistor only when the electric system was reset. The present inventor concluded that the input and output node was to be connected to an internal power supply line or an internal ground line at the system reset from the aspect of the power consumption.

To accomplish the object, the present invention proposes to control a switching element connected between a pull-up/pull-down resistor and a constant power line.

In accordance with one aspect of the present invention, there is provided a semiconductor integrated circuit device fabricated on a semiconductor chip comprising an interface circuit connected between a first node and a second node connectable to an external circuit for transferring a piece of information between the first node and the second node, a pull-down element connected to the second node, a switching element connected between the pull-down element and a constant power source, and responsive to a control signal at a control node thereof so as to be changed between on-state and off-state, and a controlling circuit having an input signal port connected to the first node and an output signal port connected to the control node of the switching element, and changing the control signal to an active level when the semiconductor integrated circuit device is reset and to an inactive level after the semiconductor integrated circuit restarts.

In accordance with another aspect of the present invention, there is provided a semiconductor integrated circuit device fabricated on a semiconductor chip comprising an interface circuit connected between a first node and a second node connectable to an external circuit for transferring a piece of information between the first node and the second node, a pull-up element connected to the second node, a switching element connected between the pull-up element and a constant power source, and responsive to a control signal at a control node thereof so as to be changed between on-state and off-state, and a controlling circuit having an input signal port connected to the first node and an output signal port connected to the control node of the switching element, and changing the control signal to an active level when the semiconductor integrated circuit device is reset and to an inactive level after the semiconductor integrated circuit restarts.

BRIEF DESCRIPTION OF THE DRAWINGS

The features and advantages of the semiconductor integrated circuit device will be more clearly understood from the following description taken in conjunction with the accompanying drawings in which.

DESCRIPTION OF THE PREFERRED EMBODIMENTS

First Embodiment

Figure 1:
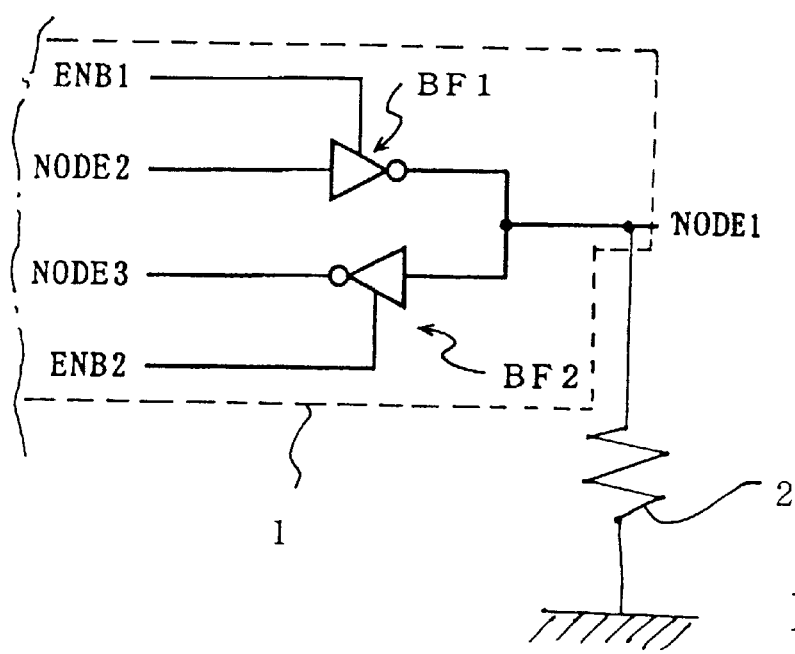
FIG. 1 is a circuit diagram showing the circuit configuration of the prior art input and output circuit.
Figure 2:
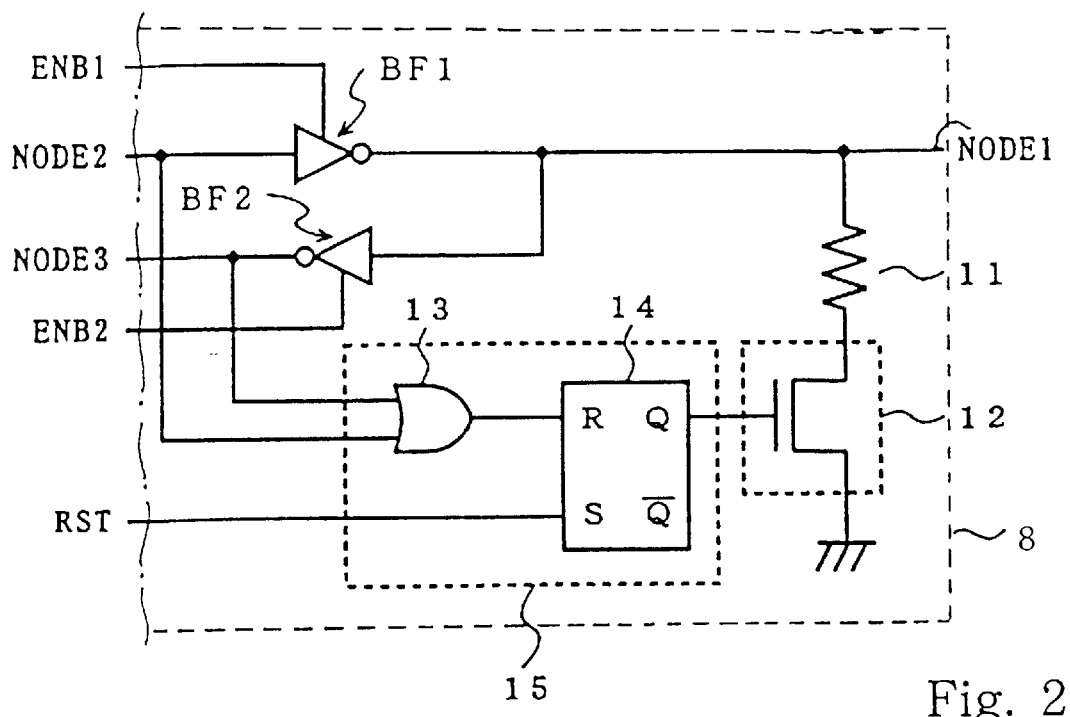
FIG. 2 is a circuit diagram showing the circuit configuration of an input and output circuit incorporated in a semiconductor integrated circuit device according to the present invention.

Referring to FIG. 2 of the drawings, a semiconductor integrated circuit device implementing the present invention includes an integrated circuit integrated on a semiconductor chip 8. An input and output circuit forms a part of the integrated circuit. Although other circuits are incorporated in the integrated circuit, they are not shown in FIG. 2.

The input and output circuit is connected between an input and output node NODE1 and internal nodes NODE2/NODE3. The input and output node NODE1 is electrically connected to one of the signal pins (not shown). When the semiconductor integrated circuit device is mounted on a circuit board, the signal pins are connected to conductive lines on a circuit board (not shown). Though not shown in FIG. 2, an external device is further mounted on the circuit board, and supplies a signal representative of a piece of information to the input and output node NODE1. The external device and the semiconductor integrated circuit device form parts of an electric system.

The input and output circuit comprises an output buffer BF1, an input buffer BF2, a pull-down resistor 11, an n-channel enhancement type switching transistor 12 and a controlling circuit 15. The output buffer BF1 and the input buffer BF2 are categorized in a tri-state circuit, and change the output nodes thereof between a high level, a low level and high-impedance state. The output buffer BF1 is connected at the input node thereof to the internal node NODE2 and at the output node thereof to the input and output node NODE1. The output buffer BF1 further has a control node, and the control node is connected to another controlling circuit. The output buffer BF1 is enabled with an enable signal ENB1 of an active level, and changes the output node between the high level and the low level depending upon the potential level at the internal node NODE2. However, the output buffer BF1 stays in the high-impedance state in the presence of the enable signal ENB1 of the inactive level. On the other hand, the input buffer BF2 is connected at the input node thereof to the input and output node NODE1 and at the output node thereof to the internal node NODE3. The input buffer BF2 also has a control node, and an enable signal ENB2 is supplied to the control node. When the enable signal ENB2 is changed from the inactive level to the active level, the input buffer BF2 recovered from the high-impedance state, and becomes responsive to the potential level at the input and output node NODE1. The input buffer BF2 drives the internal node NODE3 depending upon the potential level at the input and output node NODE1.

The pull-down resistor 11 and the n-channel enhancement type switching transistor 12 are connected in series between the input and output node NODE1 and the internal ground line. The controlling circuit 15 includes an OR gate 13 and an R-S flip flop circuit 14. The internal nodes NODE2/NODE3 are connected to the input nodes of the OR gate 13, and the output node of the OR gate 13 is connected to the reset node R of the R-S flip flop circuit 14. A reset signal RST is directly supplied to the set node S of the R-S flip flop circuit 14. The output node Q is connected to the gate electrode of the n-channel enhancement type switching transistor 12.

The input and output circuit behaves as follows. When the electric system is reset, the reset signal is changed to the active high level, and the R-S flip flop circuit 14 changes the output node Q to the high level. The high level is supplied to the gate electrode of the n-channel enhancement type switching transistor 12, and the n-channel enhancement type switching transistor 12 turns on. Then, the input and output node NODE1 is grounded through the pull-down resistor 11 and the n-channel enhancement type field effect transistor 12. The input and output node NODE1 is discharged to the internal ground line. Thus, the input and output node NODE1 is fixed to the ground level, and makes the integrated circuit and other devices on the circuit board stable. Thereafter, the reset signal RST is recovered to the inactive low level. The R-S flip flop circuit 14 keeps the output node Q high, and the input and output node NODE1 is continuously connected through the pull-down resistor 11 and the n-channel enhancement type switching transistor 12 to the internal ground line.

The internal node NODE2 is changed to the high level sometime after the restart. The OR gate 13 changes the reset node R to the high level, and the R-S flip flop circuit 14 changes the output node Q to the low level. Otherwise, the input buffer BF2 changes the internal node NODE3 to the high level sometime after the restart. The OR gate 13 also changes the reset node R to the high level, and the R-S flip flop circuit 14 changes the output node Q to the low level. The R-S flip flop circuit 14 supplies the low level from the output node Q to the gate electrode of the n-channel enhancement type field effect transistor 12, and the n-channel switching transistor 12 turns off. Then, the input and output node NODE1 is electrically isolated from the internal ground line, and no or negligible current flows through the pull-down resistor 11 and the n-channel enhancement type switching transistor 12. Even though the internal node NODE2 or NODE3 is recovered to the low level, the R-S flip flop circuit 14 keeps the output node Q low, and the n-channel enhancement type switching transistor 12 continuously isolates the input and output node NODE1 from the internal ground line. For this reason, the input and output circuit does not waste the electric power, and a standard power supply circuit is employed in the semiconductor integrated circuit device.

The enable signals ENB1 and ENB2 are never concurrently changed to the active level. When a piece of information is supplied from the integrated circuit to the outside of the semiconductor integrated circuit device, the enable signal ENB1 is changed to the active level, and the other enable signal ENB2 is changed to the inactive level. With the enable signal ENB1 of the active level, the output buffer BF1 becomes responsive to the potential level at the internal node NODE2. However, the other enable signal ENB2 of the inactive level causes the input buffer BF2 to enter the high impedance state. A signal representative of the piece of information is supplied to the internal node NODE2, and, accordingly, the output buffer BF1 drives the input and output node NODE1 to a certain level representative of the piece of information. The output buffer BF1 is not expected to flow a large amount of current to the input and output node NODE1, because the n-channel enhancement type switching transistor 12 is turned off.

On the other hand, when a piece of information is to be taken into the integrated circuit, the enable signal ENB1 is recovered to the inactive level, and the other enable signal ENB2 is changed to the active level. The output buffer BF1 enters the high-impedance state, and the input buffer BF2 becomes responsive to the potential level at the input and output node NODE1. An output signal source of the electric system drives the input and output node NODE1 to a potential level representative of the piece of information, and the input buffer BF2 changes the internal node to or keeps it at a potential level representative of the piece of information. No or negligible current flows into the ground line. For this reason, the external signal source does not consume a large amount of electric current.

As will be understood from the foregoing description, although the pull-down resistor 11 is integrated on the semiconductor chip together with the integrated circuit, the n-channel enhancement type switching transistor 12 is turned on when the electric system is reset. The n-channel enhancement type field effect transistor 12 isolates the input and output node NODE1 from the ground line during the operation of the integrated circuit. In other words, the input and output node NODE1 is grounded only before the semiconductor integrated circuit device restarts. Thus, the n-channel enhancement type switching transistor 12 permits the manufacturer to integrate the pull-down resistor 11 on the semiconductor chip without sacrifice of the power consumption. The semiconductor integrated circuit device does not require any large internal power supply circuit. If a system composer employs the semiconductor integrated circuit device in an electric system, the production cost is reduced, because any discrete device is not required for the stability of the integrated circuit.

Second Embodiment

Figure 3:
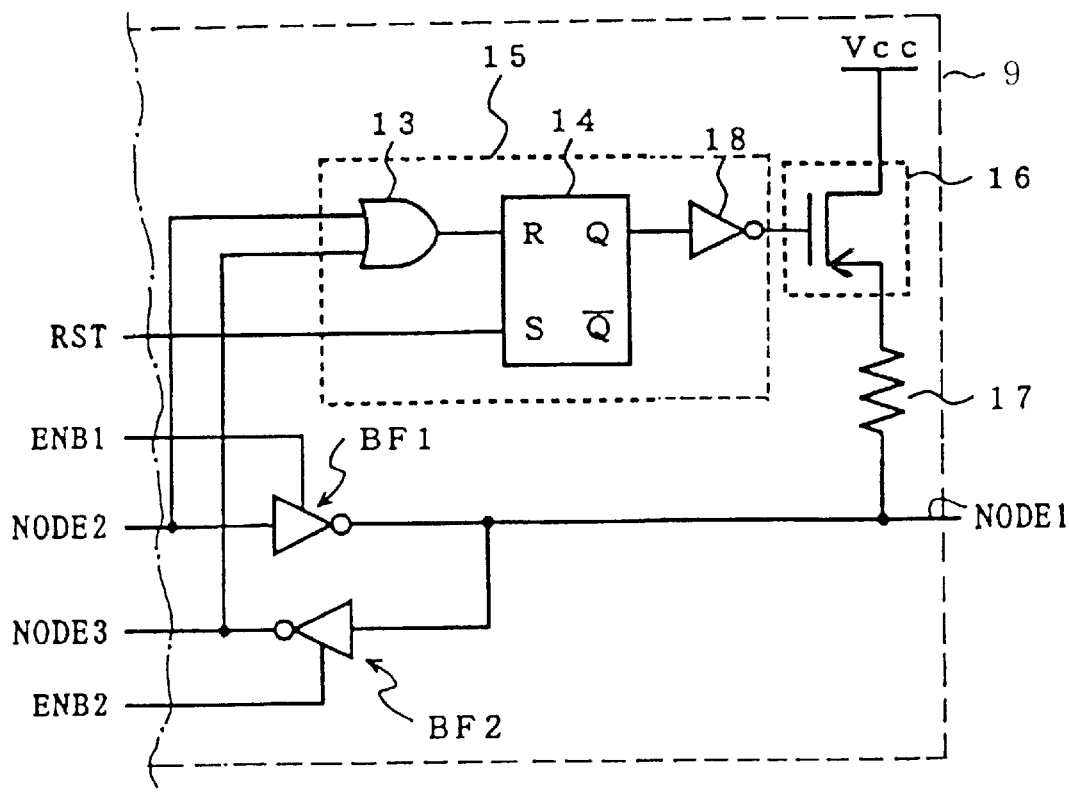
FIG. 3 is a circuit diagram showing the circuit configuration of an input and output circuit incorporated in another semiconductor integrated circuit device according to the present invention.

Turning to FIG. 3 of the drawings, another semiconductor integrated circuit device is realized on a semiconductor chip 9. The integrated circuit includes an input and output circuit and other circuits (not shown).

The input and output circuit is connected between an input and output node NODE1 and internal nodes NODE2/NODE3. The input and output node NODE1 is electrically connected to one of the signal pins (not shown). When the semiconductor integrated circuit device is mounted on a circuit board, the signal pins are connected to conductive lines on a circuit board (not shown). Though not shown in FIG. 3, an external device is further mounted on the circuit board, and supplies a signal representative of a piece of information to the input and output node NODE1. The external device and the semiconductor integrated circuit device form parts of an electric circuit.

The input and output circuit comprises an output buffer BF1, an input buffer BF2, a pull-up resistor 17, a p-channel enhancement type switching transistor 16 and a controlling circuit 15. The output buffer BF1 and the input buffer BF2 are categorized in a tri-state circuit, and change the output nodes thereof between a high level, a low level and high-impedance state. The output buffer BF1 is connected at the input node thereof to the internal node NODE2 and at the output node thereof to the input and output node NODE1. The output buffer BF1 further has a control node, and the control node is connected to another controlling circuit. The output buffer BF1 is enabled with an enable signal ENB1 of an active level, and changes the output node between the high level and the low level depending upon the potential level at the internal node NODE2. However, the output buffer BF1 stays in the high-impedance state in the presence of the enable signal ENB1 of the inactive level.

On the other hand, the input buffer BF2 is connected at the input node thereof to the input and output node NODE1 and at the output node thereof to the internal node NODE3. The input buffer BF2 also has a control node, and an enable signal ENB2 is supplied to the control node. When the enable signal ENB2 is changed from the inactive level to the active level, the input buffer BF2 recovered from the high-impedance state, and becomes responsive to the potential level at the input and output node NODE1. The input buffer BF2 drives the internal node NODE3 depending upon the potential level at the input and output node NODE1.

The pull-up resistor 17 and the p-channel enhancement type switching transistor 16 are connected in series between the input and output node NODE1 and an internal power supply line Vcc. The controlling circuit 15 includes an OR gate 13, an R-S flip flop circuit 14 and an inverter 18. The internal nodes NODE2/NODE3 are connected to the input nodes of the OR gate 13, and the output node of the OR gate 13 is connected to the reset node R of the R-S flip flop circuit 14. A reset signal RST is directly supplied to the set node S of the R-S flip flop circuit 14. The output node Q is connected through the inverter 18 to the gate electrode of the p-channel enhancement type switching transistor 16.

The input and output circuit behaves as follows. When the electric system is reset, the reset signal is changed to the active high level, and the R-S flip flop circuit 14 changes the output node Q to the high level. The inverter 18 changes the high level to the low level, and the low level is supplied to the gate electrode of the p-channel enhancement type switching transistor 16. With the low level, the p-channel enhancement type switching transistor 16 turns on. Then, the input and output node NODE1 is connected through the pull-up resistor 17 and the p-channel enhancement type field effect transistor 16 to the internal power supply line Vcc. The input and output node NODE1 is charged to the internal power voltage level. Thus, the input and output node NODE1 is fixed to the internal power voltage level, and makes the integrated circuit and other devices on the circuit board stable. Thereafter, the reset signal RST is recovered to the inactive low level. The R-S flip flop circuit 14 keeps the output node Q high, and, accordingly, the inverter 18 fixes the gate electrode of the p-channel enhancement type field effect transistor 16 to the low level. This results in that the input and output node NODE1 is continuously connected through the pull-up resistor 17 and the p-channel enhancement type switching transistor 16 to the internal power supply line Vcc.

The internal node NODE2 is changed to the high level sometime after the restart. The OR gate 13 changes the reset node R to the high level, and the R-S flip flop circuit 14 changes the output node Q to the low level. Otherwise, the input buffer BF2 changes the internal node NODE3 to the high level sometime after the restart. The OR gate 13 also changes the reset node R to the high level, and the R-S flip flop circuit 14 changes the output node Q to the low level. The R-S flip flop circuit 14 supplies the low level from the output node Q to the inverter 18, and the inverter 18 supplies the high level to the gate electrode of the p-channel enhancement type field effect transistor 16. With the high level, the p-channel enhancement type switching transistor 16 turns off. Then, the input and output node NODE1 is electrically isolated from the internal power supply line Vcc, and no or negligible current flows through the p-channel enhancement type switching transistor 16 and the pull-up resistor 17. Even though the internal node NODE2 or NODE3 is recovered to the low level, the R-S flip flop circuit 14 keeps the output node Q low, and the inverter 18 permits the p-channel enhancement type switching transistor 16 to continuously isolate the input and output node NODE1 from the internal power supply line Vcc. For this reason, the input and output circuit does not waste the electric power, and a standard power supply circuit is employed in the semiconductor integrated circuit device.

The enable signals ENB1 and ENB2 are never concurrently changed to the active level. When a piece of information is supplied from the integrated circuit to the outside of the semiconductor integrated circuit device, the enable signal ENB1 is changed to the active level, and the other enable signal ENB2 is changed to the inactive level. With the enable signal ENB1 of the active level, the output buffer BF1 becomes responsive to the potential level at the internal node NODE2. However, the other enable signal ENB2 of the inactive level causes the input buffer BF2 to enter the high impedance state. A signal representative of the piece of information is supplied to the internal node NODE2, and, accordingly, the output buffer BF1 drives the input and output node NODE1 to a certain level representative of the piece of information.

On the other hand, when a piece of information is to be taken into the integrated circuit, the enable signal ENB1 is recovered to the inactive level, and the other enable signal ENB2 is changed to the active level. The output buffer BF1 enters the high-impedance state, and the input buffer BF2 becomes responsive to the potential level at the input and output node NODE1. An output signal source of the electric system drives the input and output node NODE1 to a potential level representative of the piece of information, and the input buffer BF2 changes the internal node to or keeps it at a potential level representative of the piece of information. While the integrated circuit is operating, no or negligible current flows from the internal power supply line Vcc to the input and output node NODE1, and the internal electric power is never wasted.

As will be understood from the foregoing description, although the pull-up resistor 17 is integrated on the semiconductor chip together with the integrated circuit, the p-channel enhancement type switching transistor 16 is turned on only when the semiconductor integrated circuit device is reset. However, the p-channel enhancement type field effect transistor 16 isolates the input and output node NODE1 from the internal power supply line Vcc during the operation of the integrated circuit. In other words, the input and output node NODE1 is pulled up only before the semiconductor integrated circuit device restarts. Thus, the p-channel enhancement type switching transistor 16 permits the manufacturer to integrate the pull-up resistor 17 on the semiconductor chip without sacrifice of the power consumption. The semiconductor integrated circuit device does not require any large internal power supply circuit. If a system composer employs the semiconductor integrated circuit device in an electric system, the production cost is reduced, because any discrete device is not required for the stability of the integrated circuit.

Although particular embodiments of the present invention have been shown and described, it will be apparent to those skilled in the art that various changes and modifications may be made without departing from the spirit and scope of the present invention.

For example, the present invention is applicable to an input circuit connected between an input node and an internal node. In this instance, the internal node may be directly connected to the reset node of the R-S flip flop circuit.

The flip flop circuit is never limited to the R-S type. Any kind of bi-stable circuit is available for the input or input/output circuit according to the present invention.

The OR gate may be replaced with another kind of logic gate such as, for example a three-input NOR gate.

What is claimed is:

1. A semiconductor integrated circuit device fabricated on a semiconductor chip, comprising:

an interface circuit connected between a first node and a second node connectable to an external circuit for transferring a piece of information between said first node and said second node;

a pull-down element connected to said second node;

a switching element connected between said pull-down element and a constant power source, and responsive to a control signal at a control node thereof so as to be changed between on-state and off-state; and a controlling circuit having a first input signal port connected to said first node and an output signal port connected to said control node of said switching element, and changing said control signal to an active level when said semiconductor integrated circuit device is reset and to an inactive level after said semiconductor integrated circuit device restarts.

2. The semiconductor integrated circuit device as set forth in claim 1, in which said interface circuit includes an input buffer connected between said second node and a first sub-node of said first node and responsive to a potential level at said second node for driving said first sub-node to one of first and second potential levels.

3. The semiconductor integrated circuit device as set forth in claim 2, in which said interface circuit further includes an output buffer connected between said second node and a second sub-node of said first node electrically isolated from said first sub-node for driving said second node to one of said first and second potential levels, and said input buffer and said output buffer are selectively enabled with enable signals.

4. The semiconductor integrated circuit device as set forth in claim 3, said controlling circuit including a logic gate having input nodes connected in parallel to said first sub-node and said second sub-node and a bi-stable circuit having a first input node connected to an output node of said logic gate and a second input node supplied with another control signal representative of a request for resetting said semiconductor integrated circuit device and an output node connected to said control node of said switching element for supplying said control signal thereto.

5. The semiconductor integrated circuit device as set forth in claim 4, in which said logic gate carries out an OR function.

6. The semiconductor integrated circuit device as set forth in claim 4, in which said bi-stable circuit is implemented by a flip flop circuit.

7. The semiconductor integrated circuit device as set forth in claim 6, in which said flip flop circuit is implemented by an R-S flip flop circuit having a reset node connected to the output node of said logic gate and a set node supplied with said another control signal and changing said control signal to said active level when said another control signal is changed to an active level representative of the reset, and said logic circuit carries out an OR operation.

8. The semiconductor integrated circuit device as set forth in claim 1, in which said switching element is an n-channel enhancement type field effect transistor, and said controlling circuit changes said control signal to an active high level when said semiconductor integrated circuit device is reset.

9. A semiconductor integrated circuit device fabricated on a semiconductor chip, comprising:

an interface circuit connected between a first node and a second node connectable to an external circuit for transferring a piece of information between said first node and said second node;

a pull-up element connected to said second node;

a switching element connected between said pull-up element and a constant power source, and responsive to a control signal at a control node thereof so as to be changed between on-state and off-state; and a controlling circuit having an input signal port connected to said first node and an output signal port connected to said control node of said switching element, and changing said control signal to an active level when said semiconductor integrated circuit device is reset and to an inactive level after said semiconductor integrated circuit device restarts.

10. The semiconductor integrated circuit device as set forth in claim 9, in which said interface circuit includes an input buffer connected between said second node and a first sub-node of said first node and responsive to a potential level at said second node for driving said first sub-node to one of first and second potential levels.

11. The semiconductor integrated circuit device as set forth in claim 10, in which said interface circuit further includes an output buffer connected between said second node and a second sub-node of said first node electrically isolated from said first sub-node for driving said second node to one of said first and second potential levels, and said input buffer and said output buffer are selectively enabled with enable signals.

12. The semiconductor integrated circuit device as set forth in claim 11, said controlling circuit including a first logic gate having input nodes connected in parallel to said first sub-node and said second sub-node, a bi-stable circuit having a first input node connected to an output node of said first logic gate and a second input node supplied with another control signal representative of a request for resetting said semiconductor integrated circuit device, and a second logic gate having an input node connected to an output node of said bi-stable circuit and an output node connected to the control node of said switching element for supplying said control signal thereto.

13. The semiconductor integrated circuit device as set forth in claim 12, in which said first logic gate and said second logic gate carry out an OR operation and a NOT operation, respectively.

14. The semiconductor integrated circuit device as set forth in claim 12, in which said bi-stable circuit is implemented by a flip flop circuit.

15. The semiconductor integrated circuit device as set forth in claim 14, in which said flip flop circuit is implemented by an R-S flip flop circuit having a reset node connected to the output node of said first logic gate and a set node supplied with said another control signal and causing said second logic circuit to change said control signal to said active level when said another control signal is changed to an active level representative of the reset, and said first logic gate and said second logic gate carry out an OR operation and a NOT operation, respectively.

16. The semiconductor integrated circuit device as set forth in claim 9, in which said switching element is an p-channel enhancement type field effect transistor, and said controlling circuit changes said control signal to an active low level when said semiconductor integrated circuit device is reset.

17. A semiconductor integrated circuit device fabricated on a single semiconductor chip, comprising:

a tri-state output buffer having an input node connected to a first internal node, an output node connected to a second internal node and a control node supplied with a first enable signal, and responsive to a potential level at said first internal node so as to drive said second internal node to one of first and second potential levels when said first enable signal is at an active level;

a tri-state input buffer having an input node connected to said second internal node, an output node connected to a third internal node and a control node supplied with a second enable signal complementary to said first enable signal, and responsive to a potential level at said second internal node so as to drive said third internal node to one of said first and second potential levels when said second enable signal is at an active level;

a series combination of a highly resistive element and a field effect switching transistor connected between said second internal node and a source of constant voltage level; and a controlling circuit having a first input port connected to said first and third internal nodes, a second input port supplied with a control signal representative of an instruction for resetting said semiconductor integrated circuit and an output port connected to a gate electrode of said field effect switching transistor, and responsive to said control signal for changing an output port control signal to an active level.

18. The semiconductor integrated circuit device as set forth in claim 17, in which said controlling circuit includes an OR gate having input nodes connected in parallel to said first node and said third node, and a flip flop circuit having a first input node connected to an output node of said logic gate, a second input node supplied with said control signal and an output node connected to the gate electrode of said field effect switching transistor.

19. The semiconductor integrated circuit device as set forth in claim 17, in which said controlling circuit includes an OR gate having input nodes connected in parallel to said first node and said third node, a flip flop circuit having a first input node connected to an output node of said first logic gate and a second input node supplied with said control signal, and an inverter having an input node connected to an output node of said flip flop circuit and an output node connected to the gate electrode of said field effect switching transistor for supplying said output port control signal thereto.

* * * * *